(12) United States Patent
Boskamp

(10) Patent No.: US 9,977,099 B2
(45) Date of Patent: May 22, 2018

(54) SYSTEMS AND METHODS FOR INTEGRATED PICK-UP LOOPS IN BODY COIL CONDUCTORS

(71) Applicant: General Electric Company, Schenectady, NY (US)

(72) Inventor: Eddy Benjamin Boskamp, Pewaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 689 days.

(21) Appl. No.: 14/585,443

(22) Filed: Dec. 30, 2014

(65) Prior Publication Data

US 2016/0187434 A1    Jun. 30, 2016

(51) Int. Cl.
| | |
|---|---|
| G01R 33/34 | (2006.01) |
| G01R 33/3415 | (2006.01) |
| G01R 33/345 | (2006.01) |
| G01R 33/36 | (2006.01) |
| G01R 33/565 | (2006.01) |

(52) U.S. Cl.
CPC ... *G01R 33/34076* (2013.01); *G01R 33/3415* (2013.01); *G01R 33/3453* (2013.01); *G01R 33/3628* (2013.01); *G01R 33/5659* (2013.01)

(58) Field of Classification Search
CPC .......... G01R 33/34046; G01R 33/3635; G01R 33/34007; G01R 33/422; G01R 33/3453; G01R 33/3678; G01R 33/34069; G01R 33/34092; G01R 33/341; G01R 33/345; G01R 33/3685; G01R 33/3692; G01R 33/5659

See application file for complete search history.

(56) References Cited

U.S. PATENT DOCUMENTS

| | | | |
|---|---|---|---|
| 4,692,705 A | 9/1987 | Hayes | |
| 4,742,304 A | 5/1988 | Schnall et al. | |
| 4,799,016 A | 1/1989 | Rezvani | |
| 5,041,790 A | 8/1991 | Tropp et al. | |
| (Continued) | | | |

FOREIGN PATENT DOCUMENTS

JP    2008067807 A    5/2009

OTHER PUBLICATIONS

International Search Report and Written Opinion for International Application No. PCT/US2015/066834 dated May 4, 2016. 9 pages.

*Primary Examiner* — Clayton E Laballe
*Assistant Examiner* — Ruifeng Pu

(57) ABSTRACT

A RF conductive member for a magnetic resonance imaging (MRI) resonator includes an opening, a butterfly pickup loop, and a sensor cable. The RF conductive member has a length, a width, and a depth, and is configured to conduct a RF conductive member current. The opening passes through the depth of the RF conductive member and is disposed along the length of the RF conductive member. The butterfly pickup loop is disposed within the opening and configured to detect the RF conductive member current. The butterfly pickup loop includes a first loop and a second loop. The second loop is proximate the first loop and co-planar with the first loop. The sensor cable extends from the butterfly pickup loop and is configured to communicably couple the butterfly pickup loop with at least one processing unit.

14 Claims, 8 Drawing Sheets

(56) References Cited

U.S. PATENT DOCUMENTS

| | | |
|---|---|---|
| 5,168,230 A | 12/1992 | Hashoian et al. |
| 5,453,692 A | 9/1995 | Takahashi et al. |
| 5,559,434 A | 9/1996 | Takahashi et al. |
| 5,572,128 A | 11/1996 | Kess |
| 5,680,047 A | 10/1997 | Srinivasan et al. |
| 5,682,893 A | 11/1997 | Meyer et al. |
| 5,998,999 A * | 12/1999 | Richard ............ G01R 33/34046 324/318 |
| 6,081,120 A | 6/2000 | Shen |
| 6,285,189 B1 | 9/2001 | Wong |
| 6,377,047 B1 | 4/2002 | Wong et al. |
| 6,466,018 B1 | 10/2002 | Dumoulin et al. |
| 6,661,229 B2 | 12/2003 | Weyers et al. |
| 6,992,486 B2 | 1/2006 | Srinivasan |
| 7,081,753 B2 | 7/2006 | Mullen et al. |
| 7,084,630 B2 | 8/2006 | Ludwig et al. |
| 7,102,350 B2 | 9/2006 | Weyers et al. |
| 7,123,012 B2 | 10/2006 | Srinivasan |
| 7,180,291 B2 | 2/2007 | Chmielewski et al. |
| 7,292,038 B2 | 11/2007 | Doty |
| 7,345,481 B2 | 3/2008 | Leussler |
| 7,501,823 B2 | 3/2009 | Nistler et al. |
| 7,733,088 B2 * | 6/2010 | Cho ................ G01R 33/34046 324/309 |
| 8,035,384 B2 * | 10/2011 | Saha ................ G01R 33/34046 324/318 |
| 8,188,737 B2 | 5/2012 | Saha |
| 2002/0158720 A1 | 10/2002 | Weyers et al. |
| 2003/0193380 A1 | 10/2003 | de Swiet et al. |
| 2005/0275403 A1 | 12/2005 | Pinkerton et al. |
| 2006/0001425 A1 | 1/2006 | Weyers et al. |
| 2006/0012370 A1 | 1/2006 | Barberi |
| 2007/0167725 A1 | 7/2007 | Tropp et al. |
| 2007/0285096 A1 * | 12/2007 | Soutome .......... G01R 33/34046 324/318 |
| 2008/0129292 A1 | 6/2008 | Leussler et al. |
| 2008/0157770 A1 | 7/2008 | Peshkovsky |
| 2009/0134873 A1 | 5/2009 | Cho et al. |
| 2010/0141258 A1 | 6/2010 | Saha |
| 2010/0179763 A1 * | 7/2010 | Overall ................ G01R 33/246 702/19 |
| 2010/0244838 A1 | 9/2010 | Okamoto et al. |
| 2014/0197836 A1 * | 7/2014 | Hamamura ............ G01R 33/44 324/318 |
| 2014/0266206 A1 | 9/2014 | Dempsey et al. |
| 2016/0033591 A1 * | 2/2016 | Leussler .............. G01R 33/288 324/309 |

\* cited by examiner

SYSTEMS AND METHODS FOR INTEGRATED PICK-UP LOOPS IN BODY COIL CONDUCTORS

BACKGROUND OF THE INVENTION

Embodiments of the present disclosure generally relate to magnetic resonance imaging (MRI) systems.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Typically, an MRI system includes a superconducting magnet that generates a main magnetic field within an imaging volume. The MM system uses various types of radio frequency (RF) coils to create pulses of RF energy. The RF coils transmit RF excitation signals and receive magnetic resonance (MR) signals that the MRI system processes to form the images.

A body resonator or birdcage configured to be disposed around a patient may be employed to transmit RF waves to generate a RF field. Conventionally, the birdcage may include two conductive rings disposed at opposite axial ends, with the two conductive rings joined by conductive rungs extending between the rings. (For an example of such a birdcage, see U.S. Pat. No. 4,692,705). The resonator or birdcage may be connected to a power amplifier, which sends energy to the resonator to be transformed into an RF field. The power may be sent through the resonator via 2 channels, for example via a quadrature splitter. For instance, an RF amp may transmit 32 kiloWatts (kW) of power through a first channel of 16 kW and a second channel of 16 kW, with the two channels at a phase difference of 90 degrees, with the RF field circularly polarized. However, with power sent through two channels for the entire resonator, there is limited adjustability for making the RF field more uniform, for example. Also, adjustment of power provided via the channels to form a field as desired may be slow and/or inaccurate due to limits on the detection of power. For example, even if power is accurately detected, the current in any given rung (or each of the rungs) may still not be accurately determined due to system losses.

BRIEF DESCRIPTION OF THE INVENTION

In one embodiment, a RF conductive member for a magnetic resonance imaging (MRI) resonator is provided that includes an opening, a butterfly pickup loop, and a sensor cable. The RF conductive member has a length, a width, and a depth, and is configured to receive and conduct a RF conductive member current. The opening passes through the depth of the RF conductive member and is disposed along the length of the RF conductive member. The butterfly pickup loop is disposed within the opening and configured to detect the RF conductive member current. The butterfly pickup loop includes a first loop and a second loop. The second loop is proximate the first loop and co-planar with the first loop. The sensor cable extends from the butterfly pickup loop and is configured to communicably couple the butterfly pickup loop with at least one processing unit.

In another embodiment, a magnetic resonance imaging (MRI) system that includes a plurality of RF conductive members and at least one processing unit is provided. The RF conductive members are disposed about a bore configured to accept a patient, each RF conductive member having a length, a width, and a depth. Each RF conductive member is configured to conduct a RF conductive member current. Each RF conductive member includes an opening, a butterfly pickup loop, and a sensor cable. The opening passes through the depth of the RF conductive member and is disposed along the length of the RF conductive member. The butterfly pickup loop is disposed within the opening and is configured to detect the RF conductive member current. The butterfly pickup loop includes a first loop and a second loop, with the second loop proximate the first loop and co-planar with the first loop. The sensor cable extends from the butterfly pickup loop to the at least one processing unit. The at least one processing unit is operably coupled to each RF conductive member via the corresponding sensor cable and a corresponding RF conductive member power unit. The at least one processing unit is configured to receive, via the corresponding sensor cable, RF conductive member current information from each RF conductive member, and to control at least one of a pulse shape, amplitude, or phase of a RF power pulse provided to at least one of the RF conductive members responsive to the received RF conductive member current information. It may be noted that the RF conductive member current information corresponds to the detected pulse shape, amplitude, and/or phase of the current passing through a given RF conductive member as detected by the corresponding butterfly pickup loop. The RF conductive members may be arranged to form a resonator which may be surrounded by a cylindrical RF shield.

In another embodiment, a method is provided that includes providing power independently to a plurality of RF conductive members of a RF resonator of a magnetic resonance imaging (MRI) system. The method also includes detecting, via a corresponding pickup loop, at least one of an amplitude, phase, or pulse shape for each of the RF conductive members. Also, the method includes determining, with at least one processing unit, operating information of the MRI system based on the detected current for each of the RF conductive members. Further, the method includes adjusting operation of the MRI system based on the operating information.

DETAILED DESCRIPTION OF THE INVENTION

Figure 1:
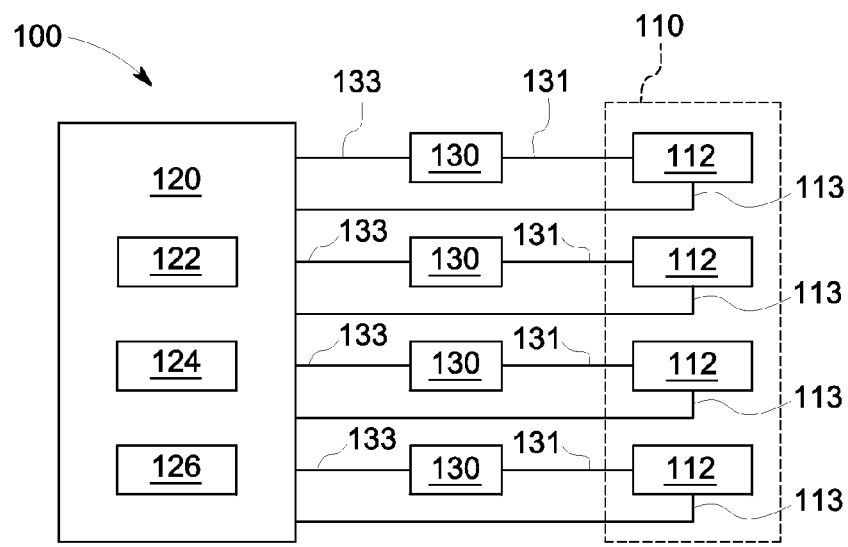
FIG. 1 illustrates a block schematic diagram of the transmit chain of a MRI system formed in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide MRI systems including a resonator (which may, in various embodiments be referred to as an RF body coil or transmit array, among others) including plural RF conductive members, with the current (e.g., pulse shape, amplitude, and/or phase of a signal provided to the RF conductive member) of each (or at least some) of the RF conductive members individually adjustable. Further, each (or at least some) of the RF conductive members have a sensor disposed thereon for detecting RF conductive member current of the particular RF conductive member. Accordingly, embodiments provide for improved field related detection (e.g., detection of pulse shape, amplitude, or phase of a current passing through individual RF conductive members instead of an overall power) as well as improved field adjustment (e.g., adjustment of individual currents for particular RF conductive members instead of only two power channels for an entire birdcage or resonator).

Various embodiments provide accurate measurement of current magnitude and phase in RF body coil RF conductive members of a MRI system (e.g., measurement of current in each of plural RF conductive members). Measured or determined current in various embodiments may be utilized to one or more of 1) determine whether or not the body coil is functioning properly; 2) accurately estimate coil losses and/or specific absorption rate (SAR) of power absorbed by a patient; 3) perform transmit gain (TG) optimization (e.g., variation of the amplitude of the pulses going to the RF power amps to find the amplitude needed for a 90 degree pulse and maximum MR signal) more quickly and/or accurately; 4) diagnose performance of a transmit chain including a RF body coil; 5) diagnose performance of receive coils and/or a receive chain (e.g., by injecting a flux into the bore and diagnosing reception by the receive coils); or 6) accurately determine the current distribution in a parallel transmit array.

In various embodiments, pickup loops are disposed in plane within RF conductive members of a RF body coil. The pickups may be configured to detect current from a particular RF conductive member in which a pickup is disposed, while minimizing or eliminating the effect of currents from other RF conductive members. For example, in some embodiments, currents from neighboring RF conductive members may provide induced voltages that are −50 dB or more down from that of the current for the immediate RF conductive member (e.g., the RF conductive member in which the pickup is disposed).

In some embodiments, the pickups and/or cables coupling the pickups with a processing unit may be disposed at virtual grounds or areas of no or low E fields, such that E fields from a RF body coil do not confound or adversely affect current measurements. The pickup loops may be shaped (e.g., in a butterfly or FIG. 8 shape) to help minimize or eliminate the effects of neighboring RF conductive member currents. The butterfly shape or configuration in various embodiments helps ensure maximum or increased coupling with B fields of the RF conductive member to which the butterfly coil is mounted, while decoupling the pickup coil from B fields associated with adjacent or neighboring RF conductive members. The pickup loops may be located in the same plane as the RF conductive members (e.g., each pickup loop is located within a depth or thickness of a corresponding RF conductive member). For example, a butterfly shaped loop may be disposed in a square hole or opening, with the loop and opening configured or selected to have a minimal effect on coil Q and frequency. A sensor cable leading from the pickup to a processing unit for current determination may connect to the pickup loop, and be routed radially to (or through) an RF shield, while staying in a zero (or near zero)

E field plane. The sensor cable may then be routed axially to exit the bore along a low reactance RF shield, for example regularly (e.g., at least once every ¼ wavelength at the system frequency) contacting the low reactance RF shield to kill or minimize E field induced currents on a shielding of the sensor cable. In various embodiments, the RF shield may be a conductive cylinder having a relatively thin shell width disposed radially outward of the resonator with a relatively small gap between the RF shield and the resonator.

Various embodiments provide improved control of fields used with MRI systems. A technical effect of at least one embodiment includes improving accuracy in determination of current (e.g., pulse shape, amplitude, and/or phase) passing through RF conductive members of a MRI resonator. A technical effect of at least one embodiment includes improved accuracy in calculating SAR. A technical effect of at least one embodiment includes improving pre-scan times (e.g., time required to adjust or optimize a field provided or related aspect of a MRI system). A technical effect of at least one embodiment includes improved diagnostics and serviceability of MRI systems. A technical effect of at least one embodiment includes reduced servicing time and/or expense for MRI systems.

Figure 13:
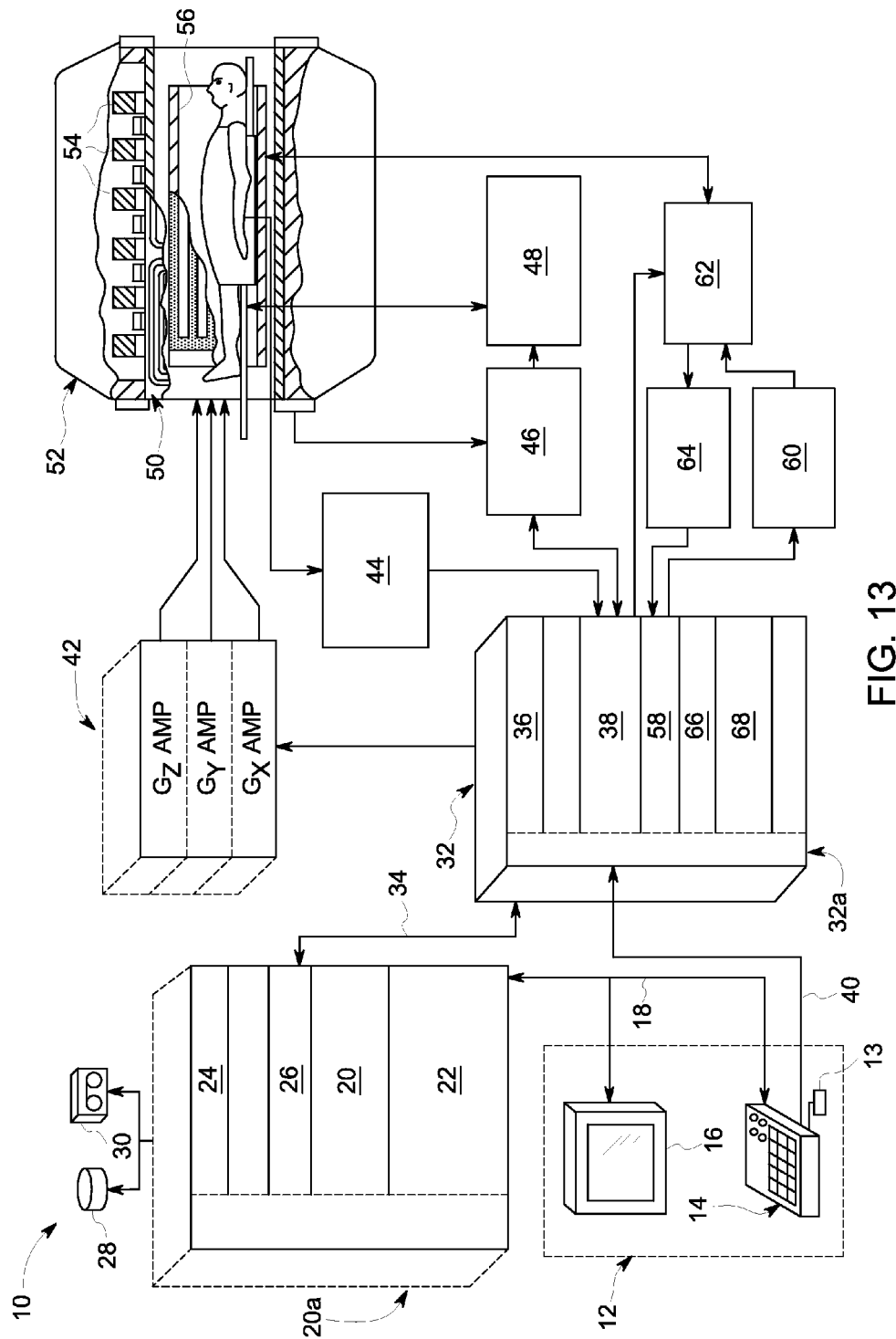
FIG. 13 illustrates a block schematic diagram of an MR system formed in accordance with various embodiments.

FIG. 1 illustrates a block schematic diagram of a MRI system 100 formed in accordance with various embodiments. It may be noted that the depicted MRI system 100 generally illustrates aspects of the system associated with RF conductive members and the generation and control of an RF field; however, for example as seen in FIG. 13, the MRI system may include additional components not shown in FIG. 1 for clarity and ease of illustration. The MRI system 100 may be utilized to perform or implement one or more aspects of processes or methods disclosed herein, for example. The MRI system 100 may be configured, for example, to perform MRI scanning of an object, such as a human or animal patient (or portion thereof). The MRI system includes a RF resonator 110, a processing unit 120, and RF power units 130. Generally, the RF resonator 110 is configured to receive a signal or RF power pulse (e.g., a signal having a pulse shape, amplitude, and phase) from the power units 130, and to generate a RF magnetic or B field to be used in conjunction with MRI scanning, and the processing unit 120 is configured to control the input pulse shape, amplitude and phase sent to the power unit 130 and subsequently provided to the RF conductive members 112 of the RF resonator 110 by the power units 130 (e.g., to control the signal amplitude, phase and shape received by individual RF conductive members). The power units 130, for example, may be power amplifiers, with the transmission of signals from the power units 130 controlled by the processing unit 120. Accordingly, in embodiments having each power unit 130 dedicated to a given RF conductive member 112 of the RF resonator 110, the current (pulse shape, amplitude, and/or phase) passing through any given RF conductive member 112 may be independently adjusted by controlling the pulse shape, amplitude, and/or phase of a signal provided to the RF conductive member 112 via the associated or corresponding power unit 130. The processing unit 120 may also be configured to receive scanning information from one or more receive coils and to reconstruct an image using the scanning information. It may be noted that various embodiments may include additional components, or may not include all of the components shown in FIG. 1. Further, it may be noted that certain aspects of the imaging system 100 shown as separate blocks in FIG. 1 may be incorporated into a single physical entity, and/or aspects shown as a single block in FIG. 1 may be shared or divided among two or more physical entities.

Figure 2:
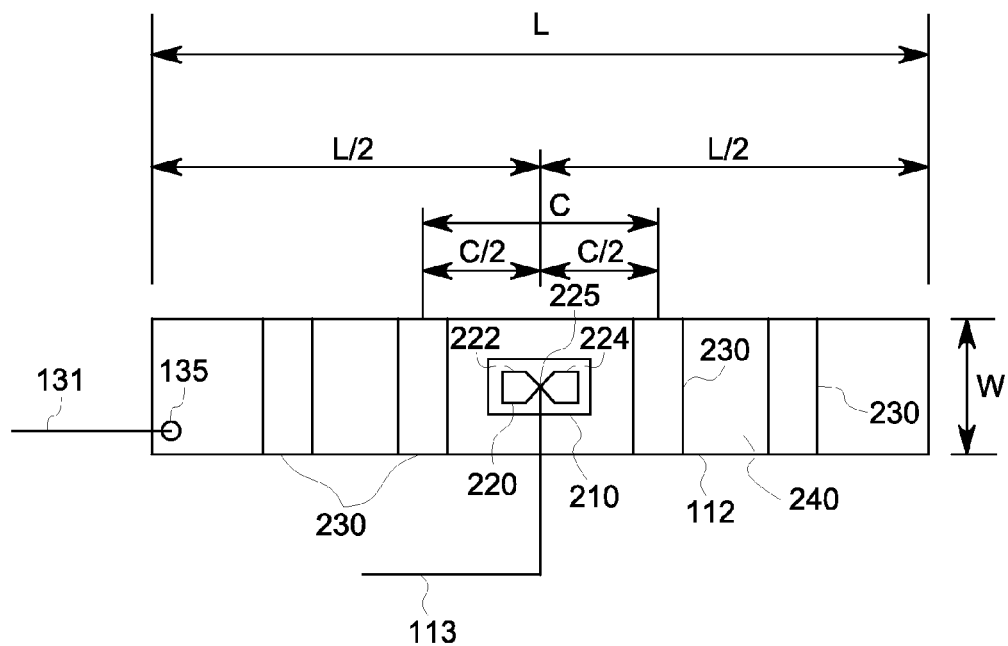
FIG. 2 illustrates a plan schematic view of a RF conductive member formed in accordance with various embodiments.
Figure 3:
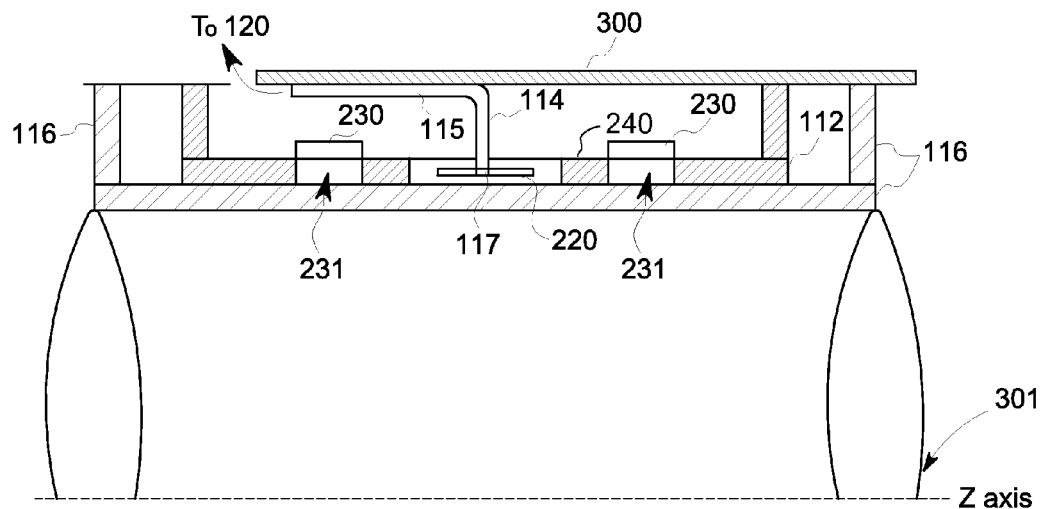
FIG. 3 illustrates a side schematic view of the RF conductive member of FIG. 2.
Figure 4:
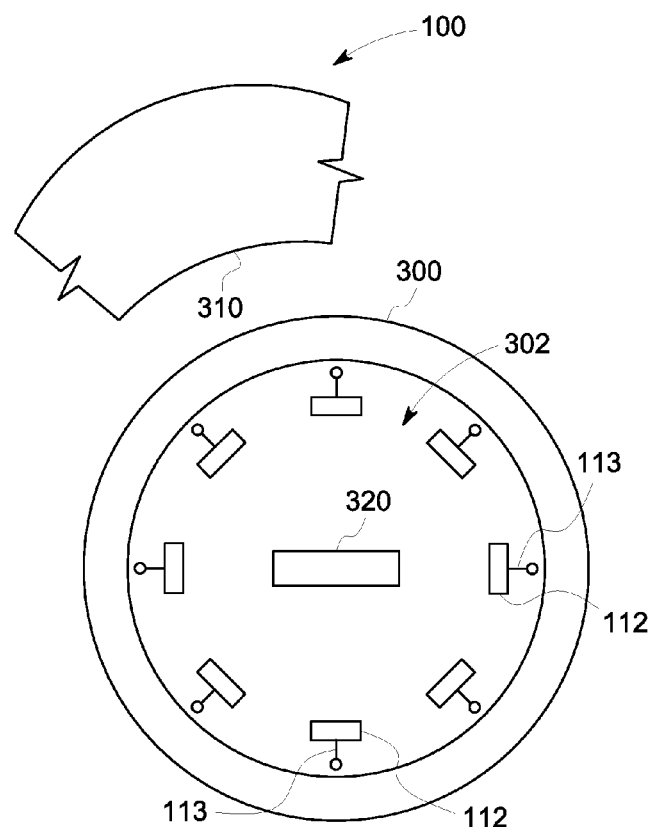
FIG. 4 illustrates an axial end view of the RF conductive member of FIG. 2.

In the illustrated embodiment, the processing unit 120 is operably coupled to the power units 130 individually via dedicated or corresponding control paths 133. As discussed herein, the power units 130 provide signals to corresponding RF conductive members 112. Each RF conductive member 112 is generally configured to resonate in response to a current passing through the RF conductive member, with the RF conductive members 112 cooperating to generate an RF field. Different types of resonators 110 and/or RF conductive members 112 may be employed in various embodiments. For example, the resonator may be a birdcage design in which the RF conductive members are configured as rungs in electrical communication with each other. As another example, the resonator may use RF conductive members configured as rungs that are joined to a single common ring and are electrically isolated from each other (see, e.g., FIG. 11 and related discussion). In such an embodiment, return current from the rungs may be communicated via an RF shield surrounding the resonator. As one more example, the resonator may include RF conductive members that are configured as loops (with the loops electrically isolated from each other) arranged to define a cylinder (see, e.g., FIG. 12 and related discussion). As each power unit 130 in the illustrated embodiment is independently controlled (e.g., supplied with an independently controlled drive signal from the processing unit 120) and provides a signal to a particular, dedicated RF conductive member 112, each RF conductive member 112 has an independently adjustable pulse shape, amplitude and phase of the current for each RF conductive member 112. In the illustrated embodiment, 4 independently powered (and monitored) RF conductive members are shown for ease of illustration; however, in practice other numbers of RF conductive members 112 may be used. For example, in some embodiments, 16 independently controlled RF conductive members 112 may be used. Use of larger numbers of RF conductive members helps provide greater control of field uniformity, while use of lower numbers of RF conductive members helps reduce system complexity and cost. It may be noted that in some embodiments, some but not all RF conductive members may be independently controlled (e.g., have a dedicated power unit 130 and/or current sensor associated therewith). For example, in some embodiments there may be two groups of RF conductive members—a first group, each of which is independently controlled, and a second group which is not independently controlled. For each RF conductive member 112 of the illustrated embodiment, a sensor (not shown in FIG. 1; see, e.g., FIGS. 2-4 and related discussion) is disposed on the RF conductive member 112 and configured to detect current (e.g., pulse shape, amplitude, phase) passing through the RF conductive member 112. The sensor is coupled to the processing unit 120 via sensor cable 113. FIGS. 2-4 illustrate additional details of a RF conductive member 112 formed in accordance with various embodiments.

FIG. 2 illustrates a plan schematic view of a RF conductive member 112, FIG. 3 illustrates a side schematic view of a RF conductive member 112, and FIG. 4 illustrates an axial end view of RF conductive members 112 formed in accordance with various embodiments. While RF resonator 110 includes a plurality of RF conductive members, only one RF conductive member 112 is shown in FIGS. 2 and 3 for clarity of illustration and ease of description. In various embodiments, the RF conductive members may be disposed about a bore 302 of an imaging system configured to accept a patient. For example, as seen in FIG. 4, a patient support table 320 is disposed within the bore 302 of the depicted MRI system 100. The depicted MRI system 100 includes 8 RF conductive members 112 radially disposed about the patient support table 320 and configured to generate a RF field within the bore 302 for MRI scanning of an object disposed on the patient support table 320. A RF shield 300 is disposed radially outward of the RF conductive members 112 as seen in FIG. 4. Additionally, a main superconducting magnet module 310 is disposed radially outward of the RF shield 300. As best seen in FIG. 3, the RF shield 300 may be a relatively thin conducting cylinder (e.g., made of copper) surrounding the RF resonator 110. The RF shield 300, for example, may have a diameter of about 75 centimeters, and be disposed about 2 centimeters radially outward of the RF resonator 110. The RF resonator 110 may have end tabs that mount the RF resonator 110 to the RF shield 300 (see, e.g., FIG. 11 and related discussion). Both the RF resonator 110 and RF shield 300 may be mounted to and supported by a support 116. The support 116, for example, may be formed from a fiberglass tube or generally cylindrically shaped fiberglass member. The fiberglass tube, for example, may have thickness of about 4 millimeters. Use of such a relatively thin tube minimizes or reduces the effect of the tube on the amount of space available to a patient. Generally, the RF conductive members 112 and the RF shield 300 have a very minimal thickness and thus insufficient mechanical strength to be self-supporting. The support 116 provides support to the RF conductive members 112 and the RF shield 300.

As best seen in FIG. 2, the RF conductive member 112 has a length L and width W. As best seen in FIG. 3, the RF conductive member 112 may extend along an axial direction (e.g., along or parallel to the axis 301 of the bore 302). In the illustrated embodiment, the RF conductive members 112 and the RF shield 300 are supported the support 116. As also best seen in FIG. 3, the RF conductive member 112 has a depth D. It may be noted that the depth D may be very small or minimal in various embodiments. In some embodiments, the RF conductive member 112 may be formed from one or more printed circuit boards providing conductive pathways through which the RF conductive member current flows. For example, the circuit board may have a first layer (e.g., an epoxy layer) to which components may be mounted, and a second, conductive layer (e.g., a copper layer) adjacent to the first layer.

The RF conductive member 112 is configured to receive and conduct a signal. In embodiments utilizing a transverse electro-magnetic (TEM) array, a return signal may flow from the RF conductive member 112 via the RF shield 300. With continued reference to FIG. 2, for example, the depicted RF conductive member 112 includes a connection point 135 or port configured to couple the RF conductive member 112 to the power line 131, so that the RF conductive member 112 receives a signal from a power unit 130 corresponding to the RF conductive member 112, resulting in a RF conductive member current passing through the RF conductive member 112. For example, the RF conductive member 112 may be formed from one or more printed circuit boards having conductive pathways therein. The currents passing through the RF conductive members disposed about the bore result in a magnetic body field within the bore. By adjusting the pulse shape, amplitude, and/or phase provided to one or more RF conductive members 112, the current passing through one or more RF conductive members 112 may be adjusted to adjust the field provided within the bore 302.

As seen in FIGS. 2 and 3, the RF conductive member 112 includes an opening 210 that passes through the depth D of the RF conductive member 112 and is disposed along the length L of the RF conductive member 112. Disposed within the opening 210 of the illustrated embodiment is a butterfly pickup loop 220. The butterfly pickup loop 220 is configured to detect the RF conductive member current (e.g., the current passing through the particular RF conductive member 112 in which a given butterfly pickup loop 220 is disposed). A butterfly loop as used herein may be understood as having a generally FIG. 8 shape including two co-planar loops that are adjacent or proximate each other. For example, the butterfly loop pickup loop 220 depicted in FIG. 2 includes a first loop 222 and a second loop 224. The second loop 224 is proximate the first loop 222 and is co-planar with the first loop 222. In the illustrated embodiment, the first loop 222 and the second loop 224 join at a common junction 225. Further, in the illustrated embodiment, the first loop 222 and second loop 224 are similarly sized and symmetric about a central axis.

Figure 5:
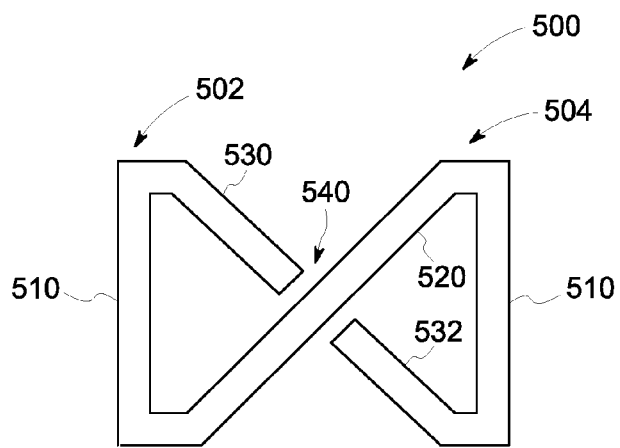
FIG. 5 illustrates a plan view of a butterfly pickup loop formed in accordance with various embodiments.

FIG. 5 illustrates a plan view of a butterfly pickup loop 500 formed in accordance with various embodiments. As seen in FIG. 5, the butterfly pickup loop 500 includes a first loop 502 and a second loop 504, which are co-planar with each other. It may be noted that the first loop 502 and the second loop 504 may be generally similar to the first loop 222 and the second loop 224 discussed in connection with FIG. 2. Each of the first loop 502 and second loop 504 includes a side portion that includes a generally straight loop segment 510. Further, the butterfly pickup loop 500 includes generally straight diagonal segments extending across at least a portion of the width of the butterfly pickup loop 500. In the illustrated embodiment, segment 520 extends continuously through the center of the butterfly pickup loop 500 and helps define portions of both the first loop 502 and the second loop 504. First diagonal segment 530 extends diagonally to a point slightly to the left of center (as shown in FIG. 5), and helps define a portion of the first loop 502. Similarly, second diagonal segment 532 extends diagonally to a point slightly to the right of center (as shown in FIG. 5), and helps define a portion of the second loop 504. An opening 540 is interposed between the first diagonal segment 530 and the second diagonal segment 532, so that the depicted butterfly pickup loop 500 may be understood as an open loop. The opening 540 helps prevent a short through the butterfly pickup loop 500, so that the butterfly pickup loop 500 may detect a voltage. The sensor cable 113 connects across the opening 540 via a voltage divider (e.g., a small network of 2 resistors). While the illustrated examples show straight segments used to form the butterfly loop, in alternate embodiments one or more curved sections of a butterfly pickup loop may be employed. The shape of the butterfly pickup loop 500 is configured so that signals from the RF conductive member in which the butterfly pickup loop 500 is embedded are detected in the first loop 502 and 504, with the signals adding up for improved detection, while signals induced therein by neighboring RF conductive members are cancelled out. The butterfly pickup loop 500 accordingly may be understood as sensitive to current of the rung within which it is disposed, but insensitive to current of adjacent or neighboring RF conductive members. Further, the butterfly loop design facilitates positioning of the butterfly pickup loop 500 within the depth of the RF conductive member 112, or in-plane with respect to the RF conductive member 112. In contrast, a single loop pickup may be required to be disposed perpendicularly to the RF conductive member 112, and/or also may be subject to confounding of the signal from signals from neighboring RF conductive members.

With continued reference to FIG. 2, it may be noted that the depicted opening 210 is disposed at a midpoint of the RF conductive member 112. With the RF conductive member 112 having a length L, the center of the opening 210 is disposed a distance L/2 from either end of the RF conductive member 112. Further, the center of the opening may be disposed at a midpoint of the width W of the RF conductive member 112. In the illustrated embodiment, the RF conductive member 112 includes capacitive regions 230 (e.g., capacitors). As seen, for example, in FIG. 3, the capacitive regions 230 may include an opening 231 or interruption in a copper layer of the RF conductive member 112, with a capacitor disposed on an upper layer opposite the opening 231 or interruption in the copper layer. The capacitors of the capacitive regions 230 may be utilized to provide a desired resonance for the RF conductive member 112. It may be noted that the capacitive regions 230 may generate E fields which may confound signals that pass through the E fields (e.g., signals passing through coaxial cable that passes through the E fields), as well as standing waves induced by the E fields on the cable shields that could have a negative effect on the behavior of the RF conductive members. In the illustrated embodiment, the capacitive regions 230 are spaced a distance C apart, and the opening 210 for the butterfly pickup loop 220 is disposed at a midpoint between 2 adjacent or neighboring capacitive regions (e.g., the center of the opening 210 is a distance C/2 from the center of either of adjacent capacitive regions 230). Positioning of the butterfly pickup loop 220 (and the sensor cable 113 extending from the butterfly pickup loop 220) at a midpoint between capacitive regions 230 helps to eliminate or reduce the confounding of a signal from the butterfly pickup loop 210 due to E fields from the capacitive regions 230.

Figure 6:
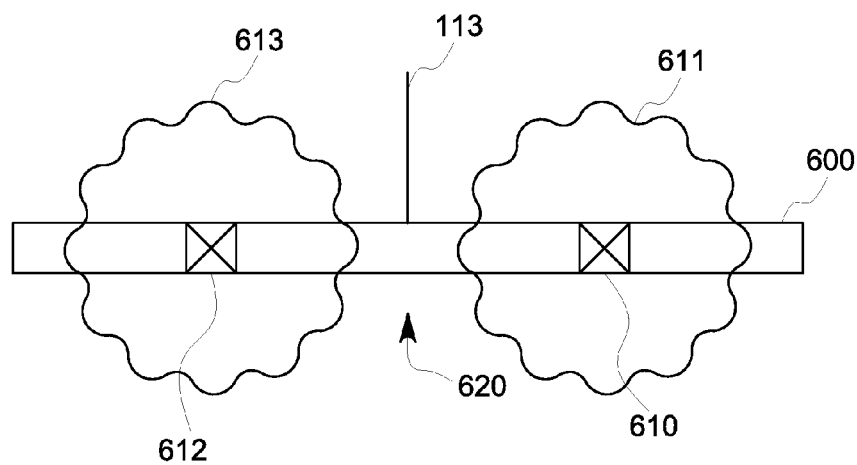
FIG. 6 illustrates a schematic view of a RF conductive member formed in accordance with various embodiments.

For example, FIG. 6 illustrates a schematic view of a RF conductive member 600 formed in accordance with various embodiments. The RF conductive member 600 includes a first capacitive region 610 that generates a first E field 611, and a second capacitive region 612 that generates a second E field 613. As seen in FIG. 6, a portion of the RF conductive member 600 located halfway between the first capacitive region 610 and the second capacitive region 612 defines a location 620 having low or no E fields. The sensor cable 113 (e.g., cable leading from a butterfly pickup loop to a processing unit) may be routed perpendicularly from the RF conductive member 600 proximate the location 620 to avoid or minimize the effects of the E field on a signal communicated via the sensor cable 113. By locating the butterfly pickup loop and a sensor cable coupling the butterfly pickup loop to a processing unit at such a location of low or no E fields, the confounding effect of the capacitive regions may be eliminated, reduced, or minimized, providing improved consistency and reliability of RF conductive member current detection.

With continued reference to FIG. 3, the sensor cable 113 is operably coupled to the butterfly pickup loop 220 and is configured to communicably couple the butterfly loop pickup loop 220 to the processing unit 120. The sensor cable 113, for example, may be a coaxial cable. As seen in FIG. 3, the sensor cable 113 includes a first portion 114 and a second portion 115. The first portion 114 is coupled to the butterfly pickup loop 220 via a voltage divider 117, and extends substantially perpendicularly with respect to surface 240 of the RF conductive member 112. As used herein, substantially perpendicularly may be understood as being within 5% of perpendicular. The second portion 115 extends from the first portion 114, but extends generally axially along a length of the RF shield 300. It may be noted that the sensor cable 113 (e.g., a shielding of the second portion 115 of the sensor cable 113) may regularly connect or make contact with the low reactance RF shield 300 to kill or minimize any induced currents on the shielding of the sensor cable 113 from the capacitive regions 230. For example, a jacket of the sensor cable 113 may be removed at portions along the length of the sensor cable 113 to facilitate contacting the RF shield 300 with the shielding of the sensor cable 113. As seen in FIG. 3, the sensor cable 113 may be advantageously routed perpendicularly from a midway point between capacitive regions 230 to eliminate or reduce the effects of any induced voltage from E fields from capacitive regions adjacent to the butterfly pickup loop 220 on the sensor cable 113, and the sensor cable 113 may also be advantageously routed axially along a length of the RF shield 300 to reduce effects of E fields from capacitive regions 230 interposed between the butterfly pickup loop 220 and the processing unit 120.

Figure 7:
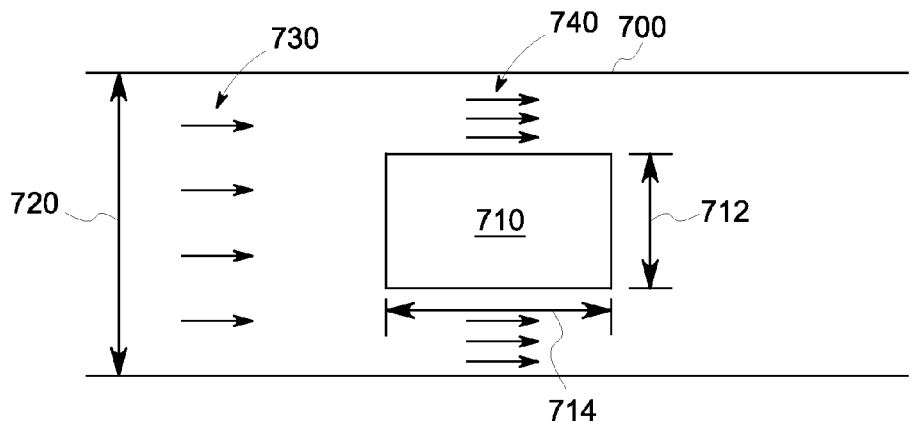
FIG. 7 is a schematic view of a RF conductive member formed in accordance with various embodiments.

With continued reference to FIG. 2, the opening 210 is sized and configured to accept the butterfly pickup loop 220. In various embodiments, the opening 210 is rectangular shaped. For example, in the illustrated embodiment, the opening 210 is a 17 millimeter×17 millimeter square opening centrally disposed on a 25 millimeter wide RF conductive member 112. The opening 210 may be sized to permit a large enough butterfly pickup loop 220 while not overly affecting the passage of current through the RF conductive member 112. For example, FIG. 7 illustrates a RF conductive member 700 formed in accordance with various embodiments. The RF conductive member 700 may be generally similar to the RF conductive member 112 discussed herein. The RF conductive member 700 has an opening 710. The RF conductive member 700 has a width 720, and the opening 710 has a width 712 and a length 714. For example, the width 720 may be 25.4 millimeters (or one inch), the width 712 may be about 17 millimeters, and the length 714 may be about 17 millimeters. As seen in FIG. 7, when an electrical signal is supplied to the RF conductive member 700 and current passes through the RF conductive member 700, a first current density 730 occurs at portions of the RF conductive member 700 not affected by the opening 710, and a second current density 740 occurs at portions of the RF conductive member 700 affected by the opening 710, with the second current density 740 greater than the first current density 730.

Figure 8:
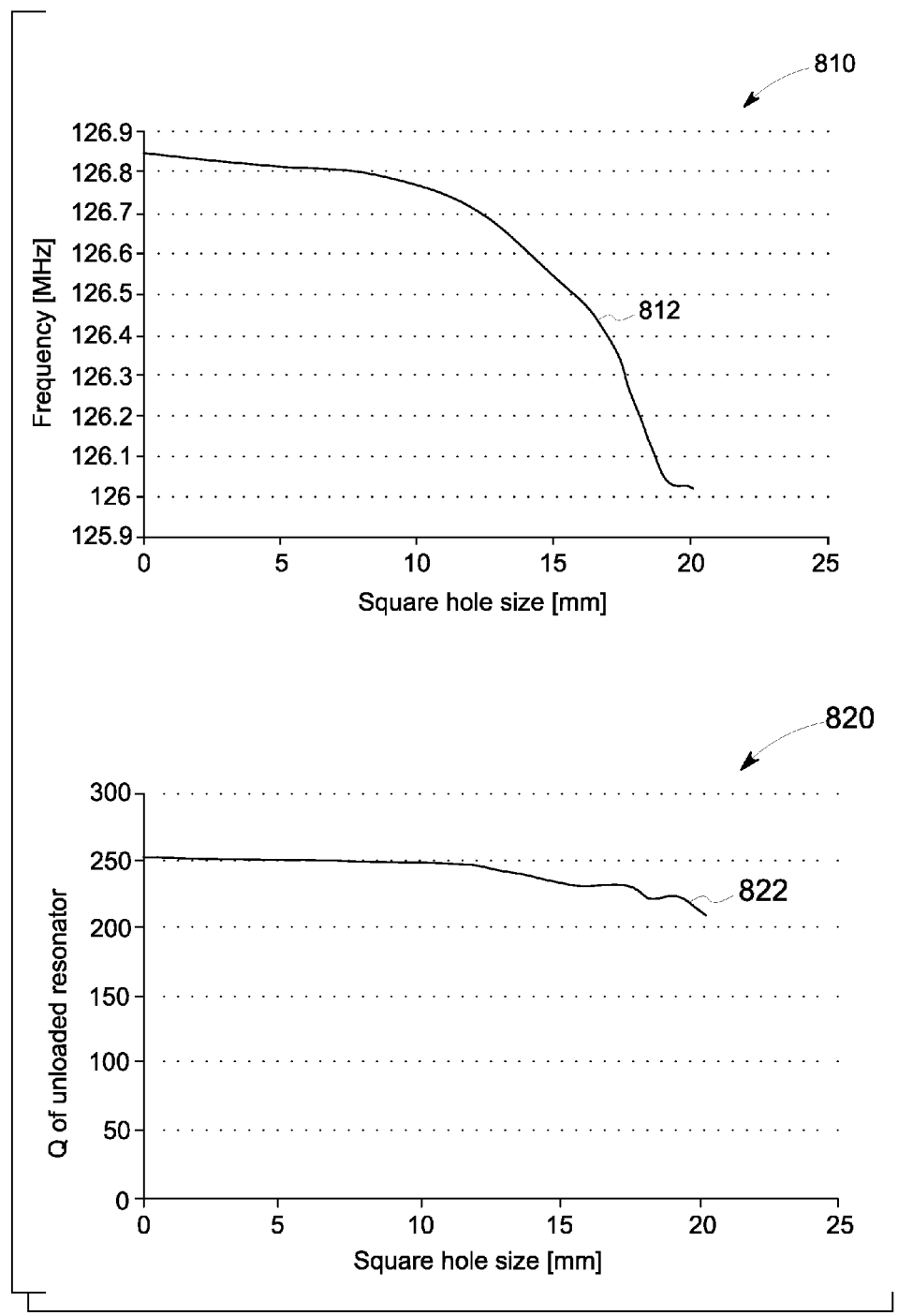
FIG. 8 includes graphs depicting the effects of the size of opening on electrical performance of a RF conductive member in accordance with various embodiments.

FIG. 8 illustrates effects of the size of opening on electrical performance of a RF conductive member in accordance with various embodiments. In FIG. 8, the RF conductive member has a width of 25.4 millimeters. The horizontal axis of each graph in FIG. 8 corresponds to the size (in millimeters) of the sides of a square opening in the RF conductive member. In graph 810, the resonance frequency of a resonator including RF conductive members with a width of 25.4 millimeters is plotted against the size of the opening, resulting in a curve 812. As seen in graph 810, the frequency between opening sizes of 0 and about 20 millimeters remains between 126 and 127 megahertz (MHz). In graph 820, unloaded quality factor (Q) of the resonator is plotted against the size of the opening, resulting in a curve 822. Q is a measure of efficiency. As seen in graph 820, for opening sizes between 0 and about 20 millimeters, the Q factor decreases with increasing opening size, but remains between about 200 to about 250. The size of the opening in various embodiments may be selected by balancing the benefits of a larger pickup loop against any decrease in Q or other measure of RF conductive member performance.

Returning to FIG. 1, the processing unit 120 is configured to receive signals from butterfly loop pickup loop 220 via the sensor cable 113, to determine a RF conductive member current for each loop, and adjust a pulse shape, amplitude, and/or phase of a signal supplied to one or more RF conductive members as appropriate. For example, to configure or set up a MRI scanner before performing a scan, the fields provided by the MRI scanner may be adjusted so that the magnitude of the transverse circularly polarized RF magnetic field (perpendicular to static magnetic field) pulse generated by the transmit chain and resonator, is sufficient to flip the nuclear spin magnetization by 90 degrees. In conventional approaches, a resonator may be adjusted or oriented by stepping up power in increments until an observed signal reaches a maximum and then decreases, with the maximum corresponding to the desired spin flipping performance. Such a process may be time consuming. In various embodiments, current passing through each RF conductive member may be determined via butterfly pickup loops disposed on each RF conductive member. Based on the current in each RF conductive member, the amount of power required for the desired spin flipping performance may be calculated, saving the time required for iteratively stepping through different power levels employed by conventional approaches. Further, detection of individual RF conductive member currents and adjustment of pulse shape, amplitude, and/or phase supplied to individual RF conductive members provides improved flexibility and adjustability in providing and/or adjusting a transmit or body field. For example, in conventional approaches using two inputs to RF conductive members that are not electrically isolated from each other (a birdcage has 2 independently controllable inputs, but not more) or independently controlled or adjustable, two controllable inputs (e.g., the shape, amplitude and phase of signal provided) are available. In contrast, for embodiments having 16 independently adjustable RF conductive members, 16 independently controllable inputs are provided.

As indicated herein, the processing unit 120 is configured to control various aspects of the power units 130 and/or RF conductive members 112, such as the drive signals or RF power pulses provided to the RF conductive members 112; and/or to determine individual RF conductive member currents (e.g., pulse shape, amplitude, phase) for the RF conductive members 112 based on information received from sensors (e.g., butterfly pickup loops) of the RF conductive members 112; and/or to reconstruct an image using information obtained during MRI scanning. The processing unit 120 of the illustrated embodiment is configured to perform one or more aspects discussed in connection with methods discussed herein (e.g., method 1000 discussed in connection with FIG. 10).

The depicted processing unit 120 is operably coupled to the power units 130 via power lines 131, and to the RF conductive members 112 (e.g., butterfly pickup loops disposed on or within the RF conductive members) via the sensor cables 113. The processing unit 120, for example, may receive RF conductive member current data corresponding to currents passing through the individual RF conductive members, and may control pulse shape, amplitude, and/or phase provided to the RF conductive members 112 via the power units 130 responsive to the received RF conductive member current information. For example, if the processing unit 120 determines, based on the received RF conductive member current information, that a field produced by the RF resonator 110 does not meet a desired level of uniformity, the processing unit 120 may adjust the pulse shape, amplitude, and/or phase provided to one or more RF conductive members 112 to achieve the desired level of uniformity. The processing unit 120 may include processing circuitry configured to perform one or more tasks, functions, or steps discussed herein. It may be noted that "processing unit" as used herein is not intended to necessarily be limited to a single processor or computer. For example, the processing unit 120 may include multiple processors and/or computers, which may be integrated in a common housing or unit, or which may distributed among various units or housings. It may be noted that operations performed by the processing unit 120 (e.g., operations corresponding to process flows or methods discussed herein, or aspects thereof) may be sufficiently complex that the operations may not be performed by a human being within a reasonable time period. For example, the determination of a field provided based on detected RF conductive member currents and/or the determination of adjustments to RF conductive member currents to modify a field may rely on or utilize computations that may not be completed by a person within a reasonable time period.

In the illustrated embodiment, the processing unit 120 includes a control module 122, an analysis module 124, and a memory 126. It may be noted that other types, numbers, or combinations of modules may be employed in alternate embodiments, and/or various aspects of modules described herein may be utilized in connection with different modules additionally or alternatively. Generally, the various aspects of the processing unit 120 act individually or cooperatively with other aspects to perform one or more aspects of the methods, steps, or processes discussed herein.

The depicted control module 122 is configured to control the pulse shape, amplitude, and/or phase of a signal received by one or more RF conductive members 112 via one or more power units 130. In the illustrated embodiment, each RF conductive member 112 is independently provided with electrical energy via a corresponding or dedicated power unit 130. Accordingly, the RF conductive member current in each RF conductive member 112 may be independently adjusted by the processing unit 120 via control of the corresponding or dedicated power unit 130 (e.g., control of a signal provided to the dedicated power unit 130). The control module 122 may also be configured to perform or assist performance of troubleshooting or diagnostic tasks. For example, the control module 122 may be configured to inject a low level RF field into the bore 302 to enable diagnosis of receive coils or a receive chain of the MRI system 100.

The depicted analysis module 124 is configured to determine operating information of the MRI system 100 based on RF conductive member current information received from current sensors (e.g., butterfly pickup loops) disposed on each RF conductive member 112. In various embodiments, each RF conductive member 112 may have a particular current sensor or pickup loop associated therewith, so that the current for each RF conductive member 112 is independently detected and may be independently determined by the analysis module 124. Accordingly, the analysis module 124 may determine an individual RF conductive member current for each RF conductive member 112. The depicted analysis module 124 is also configured to determine field information (e.g., a strength and/or orientation of one or more fields) corresponding to fields generated by the RF resonator 110 based on the individual RF conductive member currents.

The depicted analysis module 124 is also configured to determine adjustments to one or more RF conductive member currents to achieve a desired system performance. For example, if the analysis module 124, based on the individual RF conductive member currents, determines that a current of one particular RF conductive member has an inappropriate phase, pulse shape, or amplitude, resulting in a non-uniform field, the analysis module may determine an appropriate adjustment to a pulse shape, amplitude, and/or phase to be supplied to the RF conductive member, and provide information to the control module 122 for controlling the signal provided to the appropriate power unit to achieve the desired current adjustment. Further, the analysis module 124 may be configured to estimate coil losses and/or specific absorption rate (SAR) of power absorbed by a patient.

Also, the analysis module 124 may additionally or alternatively be configured for troubleshooting or diagnostic tasks of one or more aspects of the MRI system 100. For example, the analysis module 124 may determine an expected signal based on a pulse shape, amplitude, and/or phase supplied to a given RF conductive member, and if the signal determined based on information from a sensor of the RF conductive member is substantially different from the expected signal, the RF conductive member may be identified as malfunctioning and/or be identified for further evaluation. As another example, the processing unit 120 may perform transmit gain (TG) optimization more quickly and/or accurately using the detected RF conductive member currents. In various embodiments, the analysis module 124 may diagnose performance of a transmit chain including a RF body coil using detected RF conductive member currents. In some embodiments, the processing unit 120 may be used in connection with diagnosing performance of receive coils and/or a receive chain. For example, the processing unit 120 may control the pickup coils of the RF conductive members to inject a flux into the bore, and may evaluate the reception by receive coils to diagnose or evaluate the receive coils.

The memory 126 may include one or more computer readable storage media. The memory 126, for example, may store acquired RF conductive member current information, values of parameters or relationship to be used in performing various aspects of the process flows or methods discussed herein (e.g., determinations regarding fields or adjustments to fields based on RF conductive member current), results of intermediate processing steps, or the like. Further, the process flows and/or flowcharts discussed herein (or aspects thereof) may represent one or more sets of instructions that are stored in the memory 126 for direction operations of the system 100.

Figure 9:
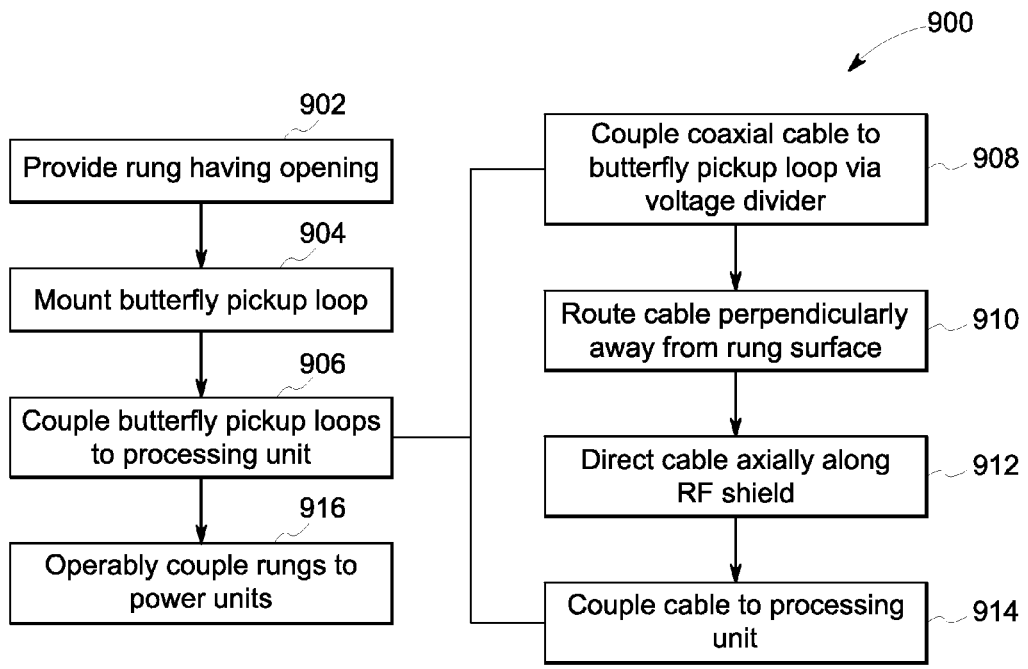
FIG. 9 is a flowchart of a method in accordance with various embodiments.

FIG. 9 provides a flowchart of a method 900 for providing a MRI body coil or resonator in accordance with various embodiments. The method 900, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 902, a RF conductive member having an opening is provided. The RF conductive member, for example, may be generally rectangular shaped rung configured to extend along an axis of a resonator, or, as another example, may be a loop extending along the axial length of a resonator. The RF conductive member is configured for passage of electrical current therethrough, and generation of a RF field for use in MRI scanning in cooperation with currents passing through other RF conductive members. The RF conductive members may be arranged in a circular or cylindrical fashion surrounding all or a portion of a body of a patient to be imaged. The opening may be disposed at a midpoint along the length of the RF conductive member and/or at a midpoint between capacitive regions of the RF conductive member as discussed herein.

At 904, a butterfly pickup loop (e.g., butterfly pickup loop 220) is mounted within the corresponding opening of at least some of the RF conductive members. In some embodiments, each RF conductive member may have a corresponding butterfly pickup loop disposed therein. The butterfly pickup loop is configured to detect current of the particular RF conductive member within which the butterfly pickup loop is mounted or disposed.

At 906, the butterfly pickup loops are operably coupled to a processing unit (e.g., processing unit 120). For example, for each butterfly pickup loop, at 908, a coaxial cable may be coupled to the butterfly pickup loop via a voltage divider. The cable may be routed, at 910, substantially perpendicularly away from a surface of the RF conductive member in a radial direction of a bore defined by the RF conductive members. At 912, the cable may be directed along an axial direction along the length of a RF shield. At 914, the cable may be coupled to the processing unit. Accordingly, the processing unit may receive RF conductive member current information from each of the butterfly pickup loops.

At 916, the RF conductive members are operably coupled to power units. For example, each RF conductive member may have a dedicated power unit, with the power units also coupled to the processing unit. Accordingly, the processing unit may control the pulse shape, amplitude, and/or phase received by (and the resulting current passing through) each of the RF conductive members. For example, the processing unit may adjust the pulse shape, amplitude, and/or phase provided to one or more RF conductive members to increase or to decrease the current passing through the one or more RF conductive members based on detected RF conductive member currents.

Figure 10:
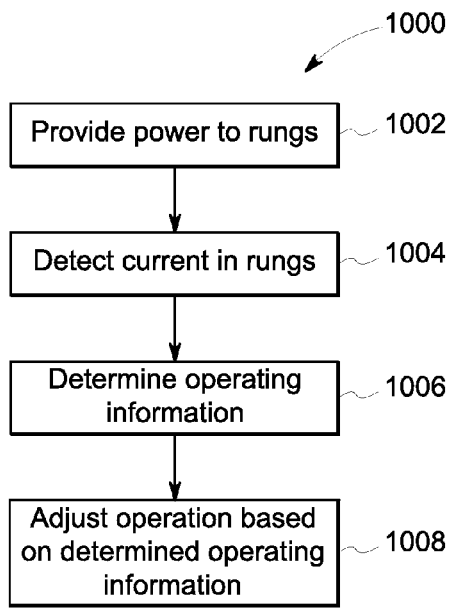
FIG. 10 is a flowchart of a method in accordance with various embodiments.

FIG. 10 provides a flowchart of a method 1000 for operating a MRI system (e.g., a body coil of a MRI system) in accordance with various embodiments. The method 1000, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 1000 may be able to be used as one or more algorithms to direct hardware (e.g., one or more aspects of the processing unit 120) to perform one or more operations described herein.

At 1002, a signal having a pulse shape, amplitude, and/or phase is provided to the RF conductive members of a resonator (e.g., RF resonator 110) of a MRI system (e.g., MRI system 100). A corresponding dedicated signal may be supplied independently to each of the RF conductive members, with the pulse shape, amplitude, and/or phase provided to each RF conductive member controlled by a processing unit (e.g., processing unit 120).

At 1004, current (e.g., one or more of the phase, amplitude, or pulse shape of the current) is detected in the RF conductive members. For example, each RF conductive member may have a sensor mounted thereto or disposed therein that is configured to detect current passing through the RF conductive member. For example, for each RF conductive member, a butterfly loop pickup may be disposed in an opening of the RF conductive member and configured to detect current passing through the RF conductive member. The butterfly loop pickup may be configured to detect current based on a B field generated by the loop. The detected current for each RF conductive member is communicated to the processing unit for analysis.

At 1006, operating information for the MRI system is determined based on the detected current for the RF conductive members. For example, a processing unit may determine the individual current for each RF conductive member based on information received from the butterfly loop pickups. Then, based on the current for each RF conductive member as well as the location of each RF conductive member (e.g., the position of each RF conductive member about a bore), the processing unit may determine field information corresponding to a field produced by a body coil formed by the RF conductive members. The field information may correspond to a strength and/or orientation of one or more fields.

At 1008, operation of the MRI system is adjusted based on the operating information. For example, if the operating information determined at 1006 corresponds to a field that is not at a desired level of uniformity, the processing unit may determine an adjustment to at least one RF conductive member current that would provide the desired level of uniformity (or improved uniformity), and control the appropriate power unit(s) to provide the determined adjustment to the at least one RF conductive member current. As another example, the operation of the MRI system may be adjusted as part of a pre-scan configuration. For example, based on the detected individual RF conductive member currents, the processing unit may determine one or more currents to adjust to provide a main field oriented at 90 degrees to an excitation field. Alternatively or additionally, the operating information determined using detected RF conductive member currents may be used to troubleshoot or diagnose a MRI system.

As indicated herein, in various embodiments, different types of resonators may be employed. For example, in some embodiments, a resonator having individual rungs extending axially along a length of the resonator, with the individual rungs electrically isolated from each other, may be employed (see, e.g., FIG. 11 and related discussion). As another example, an array of loops, with the loops arranged to define a cylinder sized to accept an object to be MR imaged, may be employed (see, e.g., FIG. 12 and related discussion).

Figure 11:
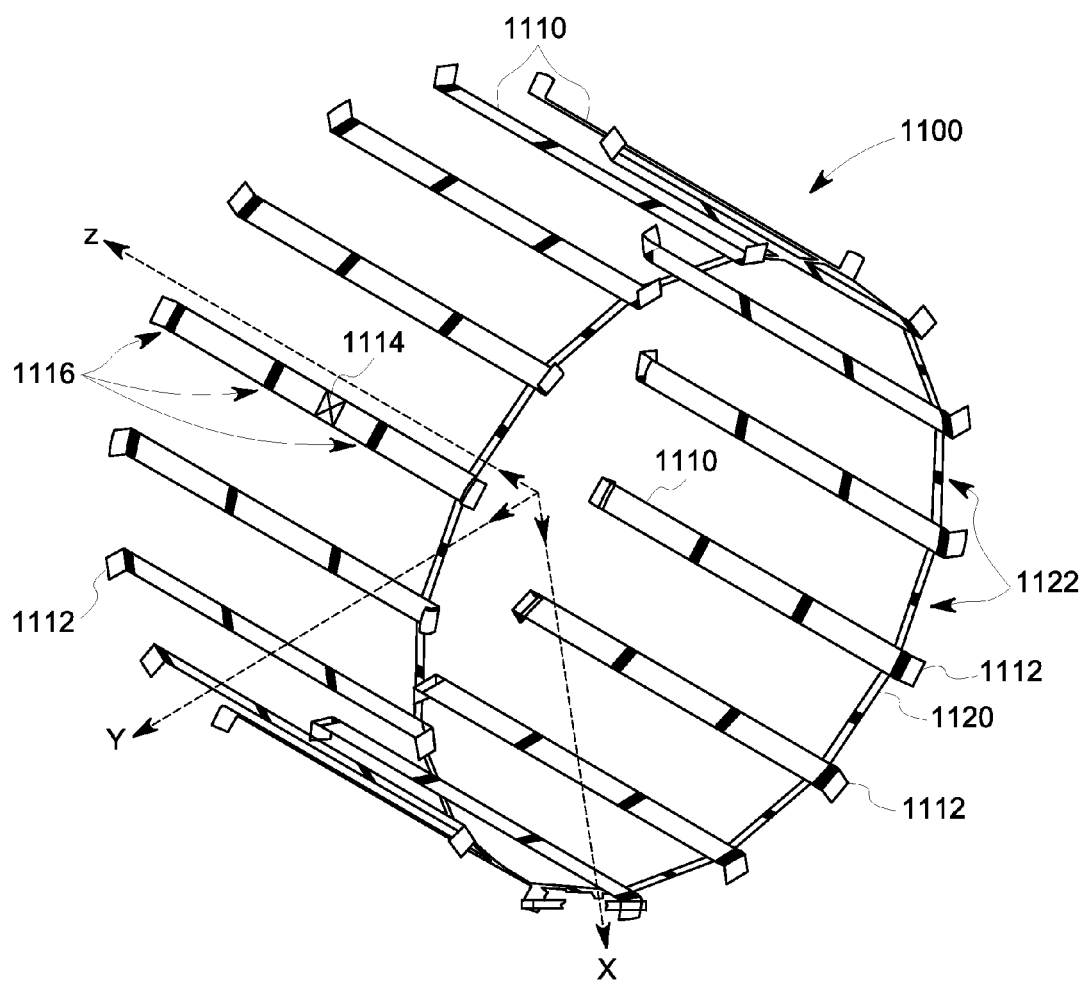
FIG. 11 illustrates a schematic diagram of an MR RF resonator formed in accordance with various embodiments.

FIG. 11 illustrates a schematic view of a RF resonator 1100 formed in accordance with various embodiments. The RF resonator 110 includes individual rungs 1110 that are arranged in a cylindrical fashion, with a ring 1120 joining the individual rungs 1110. The rungs 1110 are electrically isolated from each other in the illustrated embodiment via isolation capacitors 1122 interposed between the rungs 1110 along the ring 1120. Each rung 1110 includes tabs 1112 disposed at opposite axial ends for mounting the rung 1110 to an RF shield. For the RF resonator 1100, an electrical signal may be provided (e.g., via a corresponding power amplified) to each rung 1110 independently, and a return signal from each rung communicated via the RF shield. Each rung also includes a pick-up loop 1114 (only one pick-up loop is shown in FIG. 11 for ease of illustration) for detecting a signal (e.g., pulse shape, amplitude, and/or phase of the signal) of the rung 1110 as described herein. Each rung 1110 includes rung capacitors 1116 configured to provide a desired resonance to the rung 1110.

Figure 12:
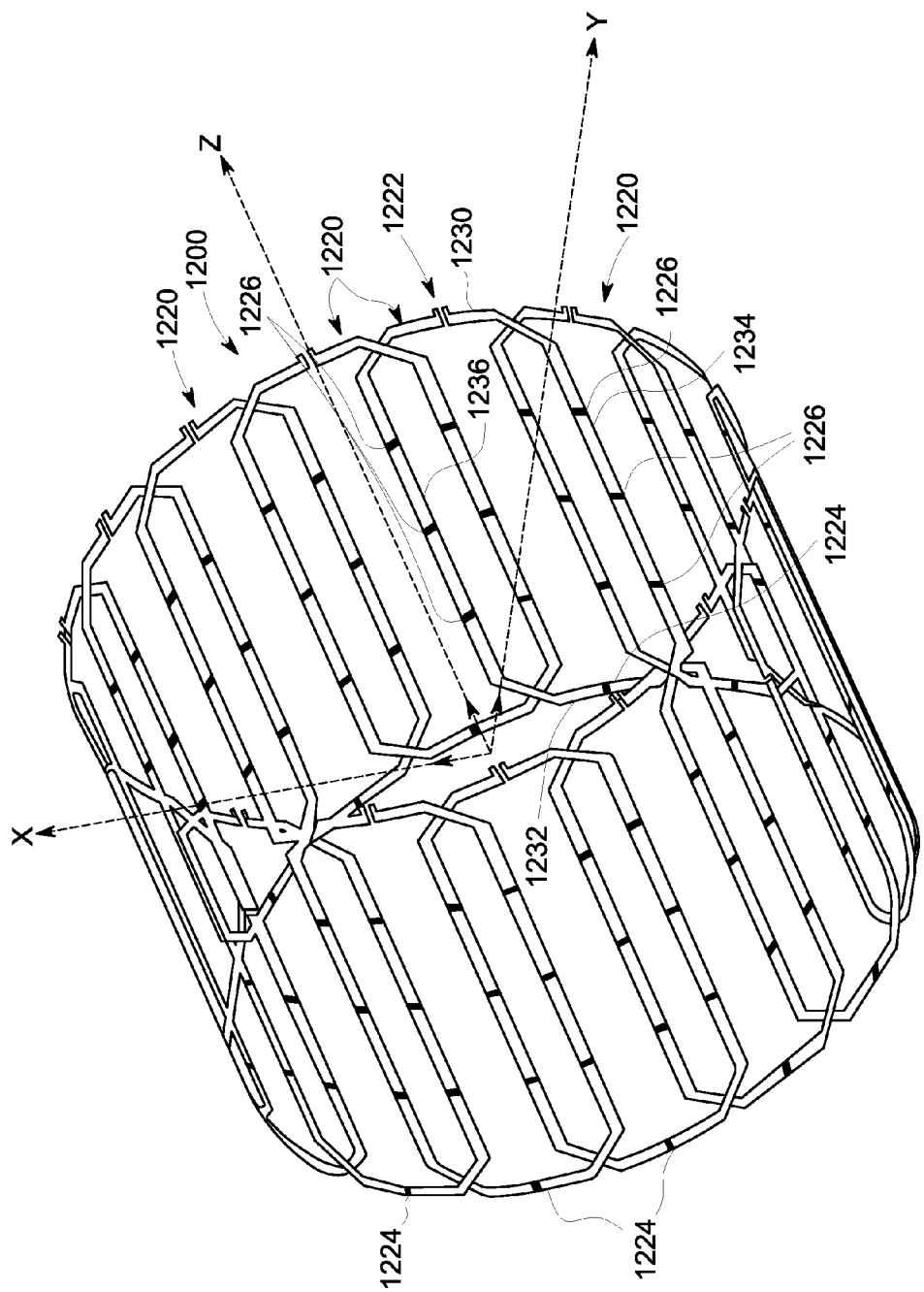
FIG. 12 illustrates a schematic diagram of an MR RF resonator formed in accordance with various embodiments.

FIG. 12 illustrates a schematic view of a resonator 1200 formed in accordance with various embodiments. The resonator 1200 includes plural loop-shaped RF conductive members 1220 arranged to form a generally cylindrically shaped resonator. The loops of the RF conductive member 1220 as shown in FIG. 12 overlap each other along the generally cylindrical shape of the resonator 1200. It may be noted that gaps may be employed between the overlapping portions of adjacent RF conductive member 1220, and that isolation networks (not shown) may be employed to help ensure that the loop conductive members are electrically isolated from each other, such that each loop conductive member may receive an independently controllable signal and have an independently detectable current. In contrast to the resonator of FIG. 11, return signals from the resonator 1200 of FIG. 12 need not be routed via the RF shield.

As seen in FIG. 12, the RF conductive member 1220 includes a first side 1230, a second side 1232 opposite the first side 1230, a third side 1234 extending between the first side 1230 and the second side 1232, and a fourth side 1236 opposite the third side 1234 and also extending between the first side 1230 and the second side 1232. The first side 1230 and the second side 1232 are disposed along the axial ends of the resonator 1200, and the third side 1234 and the fourth side 1236 extend along the axial length of the resonator 1200. In the illustrated embodiment, capacitors 1226 are disposed along the third side 1234 and the fourth side 1236. The capacitors 1226 may be configured to provide a desired resonance to the resonator 1200. The arrangement depicted in FIG. 12 is meant by way of example. For instance, the particular arrangement or location of capacitors 1226 may differ in various embodiments.

A drive point 1222 is located midway along the first side 1230 as seen in FIG. 12. A first end of the RF conductive member 1220 may be separated by a gap (e.g., a capacitive break) from a second end of the RF conductive member 1220 at the drive point 1222, with a signal transmitted to the RF conductive member 1220 received at the drive point 1222 via the first end, and a return signal sent from the RF conductive member at the drive point 1222 via the second end.

In the embodiment depicted in FIG. 12, a pickup loop 1224 is disposed midway along the second side 1232, opposite the drive point 1222 or located on an opposite axial end relative to the axial end on which the drive point 1222 is disposed. With the length L of the RF conductive member 1220 defined as the circumference or path defined by the loop, the pickup loop 1224 is located at L/2 in the illustrated embodiment. With the RF conductive member 1220 driven in symmetric fashion, the location of the pickup loop at the depicted position is at a virtual ground. Also, with the pickup loop 1224 shown at the midway point of the second side 1232, a sensor cable leading from the pickup loop 1224 may be routed directly from the axial end of the RF conductive member 1220 without having to be routed around E fields of capacitors.

Various methods and/or systems (and/or aspects thereof) described herein may be implemented using a medical imaging system. For example, FIG. 13 depicts various major components of a MRI system 10 formed in accordance with various embodiments. The operation of the system is controlled from an operator console 12 which includes a keyboard or other input device 13, a control panel 14, and a display 16. The console 12 communicated through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light want, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the san sequence that is to be performed. The pulse generator module 38 operates the system components to carry out the desired scan sequence and produce data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensor connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or apportion thereof and coupled through transmit/receive switch 62 to a preamplifier 64. The amplified MR signals are demodulated, filtered, and digitized in the receive section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A RF conductive member for a magnetic resonance imaging (MRI) resonator, the RF conductive member having a length, a width, and a depth, the RF conductive member configured to conduct a RF conductive member current, the RF conductive member comprising:
    an opening passing through the depth of the RF conductive member and disposed along the length of the RF conductive member;
    a butterfly pickup loop disposed within the opening and configured to detect the RF conductive member current pulse shape, magnitude and phase, the butterfly pickup loop comprising a first loop and a second loop, the second loop proximate the first loop and co-planar with the first loop; and
    a sensor cable extending from the butterfly pickup loop and configured to communicably couple the butterfly pickup loop with at least one processing unit; and
    wherein the sensor cable is a coaxial cable extending substantially perpendicular from a surface of the RF conductive member.

2. The RF conductive member of claim 1, wherein the RF conductive member further comprises capacitive regions, wherein the opening is disposed at a midpoint between adjacent capacitive regions.

3. The RF conductive member of claim 1, wherein the opening is disposed at a midpoint of the length.

4. The RF conductive member of claim 1, further comprising a voltage divider interposed between the butterfly pickup loop and the sensor cable.

5. The RF conductive member of claim 1, wherein the opening is rectangular shaped.

6. The RF conductive member of claim 1, wherein the butterfly pickup loop comprises straight segments arranged to form the first loop and the second loop.

7. The RF conductive member of claim 1, wherein the RF conductive member is formed from a printed circuit board.

8. A magnetic resonance imaging (MRI) system comprising:
    a plurality of RF conductive members disposed about a bore configured to accept a patient, each RF conductive member having a length, a width, and a depth, and configured to conduct a RF conductive member current, each RF conductive member comprising:
        an opening passing through the depth of the RF conductive member and disposed along the length of the RF conductive member;
        a butterfly pickup loop disposed within the opening and configured to detect the RF conductive member current, the butterfly pickup loop comprising a first loop and a second loop, the second loop proximate the first loop and co-planar with the first loop; and
        a sensor cable extending from the butterfly pickup loop; and
    at least one processing unit operably coupled to each RF conductive member via the corresponding sensor cable and a corresponding RF conductive member power unit, the at least one processing unit configured to:
        receive, via the corresponding sensor cable, RF conductive member current information from each RF conductive member; and control at least one of a pulse shape, magnitude, or phase of a RF power pulse provided to at least one of the RF conductive members responsive to the received RF conductive member current information;

a radio frequency (RF) shield forming a cylinder disposed radially outward of the RF conductive members, wherein, for each RF conductive member, the sensor cable is a coaxial cable comprising a first portion and a second portion, the first portion operably coupled to the butterfly pickup loop and extending substantially perpendicularly from a surface of the RF conductive member through the RF shield, the second portion extending along a length of the RF shield and electrically connected therewith.

9. The MRI system of claim 8, wherein, for each RF conductive member, the RF conductive member further comprises capacitive regions, wherein the opening is disposed at a midpoint between adjacent capacitive regions.

10. The MRI system of claim 8, wherein, for each RF conductive member, the opening is disposed at a midpoint of the length.

11. The MRI system of claim 8, wherein each RF conductive member further comprises a voltage divider interposed between the corresponding butterfly pickup loop and the corresponding sensor cable.

12. The MRI system of claim 8, wherein, for each RF conductive member, the opening is rectangular shaped.

13. The MRI system of claim 8, wherein, for each RF conductive member, the butterfly pickup loop comprises straight segments arranged to form the first loop and the second loop.

14. The MRI system of claim 8, wherein each RF conductive member is formed from a corresponding printed circuit board.

* * * * *